(12) United States Patent
Wang et al.

(10) Patent No.: US 12,495,658 B2
(45) Date of Patent: Dec. 9, 2025

(54) DISPLAY UNIT AND DISPLAY PANEL

(71) Applicants: CHUZHOU HKC OPTOELECTRONICS TECHNOLOGY CO., LTD., Chuzhou (CN); HKC CORPORATION LIMITED, Shenzhen (CN)

(72) Inventors: Guangjia Wang, Chuzhou (CN); Haijiang Yuan, Chuzhou (CN)

(73) Assignees: CHUZHOU HKC OPTOELECTRONICS TECHNOLOGY CO., LTD., Chuzhou (CN); HKC CORPORATION LIMITED, Shenzhen (CN)

(*) Notice: Subject to any disclaimer, the term of this patent is extended or adjusted under 35 U.S.C. 154(b) by 456 days.

(21) Appl. No.: 18/083,821

(22) Filed: Dec. 19, 2022

(65) Prior Publication Data

US 2023/0402576 A1  Dec. 14, 2023

(30) Foreign Application Priority Data

Jun. 8, 2022 (CN) .......................... 202210641369.5

(51) Int. Cl.
*H10H 29/49* (2025.01)
*G02F 1/1345* (2006.01)
(Continued)

(52) U.S. Cl.
CPC .......... *H10H 29/49* (2025.01); *G02F 1/1345* (2013.01); *G02F 1/13629* (2021.01);
(Continued)

(58) Field of Classification Search
None
See application file for complete search history.

(56) References Cited

U.S. PATENT DOCUMENTS

| | | | |
|---|---|---|---|
| 2012/0092308 A1* | 4/2012 | Chiang | G02F 1/1345 345/204 |
| 2012/0313905 A1* | 12/2012 | Kang | G02F 1/1345 445/24 |
| 2018/0197484 A1* | 7/2018 | Moon | H10K 59/123 |

FOREIGN PATENT DOCUMENTS

| | | |
|---|---|---|
| CN | 112652697 A | 4/2021 |
| CN | 114005848 A | 2/2022 |
| CN | 114242864 A | 3/2022 |

OTHER PUBLICATIONS

The first office action issued in corresponding CN application No. 202210641369.5 dated Feb. 14, 2023.

* cited by examiner

*Primary Examiner* — Feifei Yeung Lopez
(74) *Attorney, Agent, or Firm* — HAUPTMAN HAM, LLP

(57) ABSTRACT

A display unit and a display panel are provided. The display unit includes a light-emitting structure and a connection structure disposed at a periphery of the light-emitting structure. The connection structure includes a substrate, a first conductive layer, an insulating layer, and a second conductive layer. The first conductive layer is disposed at a side of the substrate. The insulating layer is disposed at the side of the substrate and covers the first conductive layer. The insulating layer at a side of the first conductive layer away from the substrate defines at least one first through-hole to make part of the first conductive layer exposed. The second conductive layer is disposed at a side of the insulating layer away from the substrate. The second conductive layer is also disposed in the at least one first through-hole and electrically coupled with the first conductive layer.

12 Claims, 5 Drawing Sheets

(51) Int. Cl.
*G02F 1/1362* (2006.01)
*G09G 5/00* (2006.01)
*H01L 25/075* (2006.01)
*H05K 3/46* (2006.01)
*H10H 20/857* (2025.01)
*H10H 29/80* (2025.01)

(52) U.S. Cl.
CPC ......... *G09G 5/003* (2013.01); *H01L 25/0753* (2013.01); *H05K 3/4644* (2013.01); *H10H 20/857* (2025.01); *H10H 29/842* (2025.01); *H01L 2224/42* (2013.01)

DISPLAY UNIT AND DISPLAY PANEL

CROSS-REFERENCE TO RELATED APPLICATIONS

This application claims priority under 35 U.S.C. § 119(a) to Chinese Patent Application No. 202210641369.5, filed Jun. 8, 2022, the entire disclosure of which is incorporated herein by reference.

TECHNICAL FIELD

This disclosure relates to the technical field of display devices, and in particular to a display unit and a display panel.

BACKGROUND

In the technical field of display devices, a display panel of a mini light-emitting diode (LED) or a micro LED usually includes multiple display units. A light-emitting structure in a display unit transmits an electrical signal with the outside through a connection structure. However, part of a surface of a first conductive layer in an existing connection structure is exposed, which is easy to be corroded. When a signal is transmitted through a corroded connection structure, the signal is easy to be interfered, such that a transmission performance and a transmission effect are reduced.

SUMMARY

A display unit is provided in a first aspect of the present disclosure. The display unit includes a light-emitting structure and a connection structure disposed at a periphery of the light-emitting structure. The connection structure includes a substrate, a first conductive layer, an insulating layer, and a second conductive layer. The first conductive layer is disposed at a side of the substrate and electrically coupled with light-emitting structure. The insulating layer is disposed at the side of the substrate and covers the first conductive layer. The insulating layer at a side of the first conductive layer away from the substrate defines at least one first through-hole to make part of the first conductive layer exposed. The second conductive layer is disposed at a side of the insulating layer away from the substrate. The second conductive layer is also disposed in the at least one first through-hole and electrically coupled with the first conductive layer. The second conductive layer is configured to be electrically coupled with a driving circuit layer.

A display panel is provided in a second aspect of the present disclosure. The display panel includes a driving circuit layer and multiple display units arranged at intervals. Each of the multiple display units includes a light-emitting structure and a connection structure disposed at a periphery of the light-emitting structure. The connection structure includes a substrate, a first conductive layer, an insulating layer, and a second conductive layer. The first conductive layer is disposed at a side of the substrate and electrically coupled with light-emitting structure. The insulating layer is disposed at the side of the substrate and covers the first conductive layer. The insulating layer at a side of the first conductive layer away from the substrate defines at least one first through-hole to make part of the first conductive layer exposed. The second conductive layer is disposed at a side of the insulating layer away from the substrate. The second conductive layer is also disposed in the at least one first through-hole and electrically coupled with the first conductive layer. The second conductive layer is configured to be electrically coupled with a driving circuit layer. The driving circuit layer is electrically coupled with second conductive layers of connection structures of the multiple display units.

BRIEF DESCRIPTION OF THE DRAWINGS

In order to explain technical solutions in implementations of the present disclosure more clearly, the following will describe accompanying drawings used for the implementations of the present disclosure.

REFERENCE SIGNS connection structure—1; substrate—11; communication region—111; protection region—112; first conductive layer—12; insulating layer—13; first through—hole—131; second through—hole—132; third through—hole—133; fourth through—hole—134; second conductive layer—14; third conductive layer—15; fourth conductive layer—16; fifth conductive layer—17; display unit—2; light—emitting structure—21; display panel—3; driving circuit layer 4; first distance—d1; second distance—d2.

DETAILED DESCRIPTION

The following are preferred implementations of the present disclosure. It should be noted that, for those of ordinary skill in the art, without departing from a concept of the present disclosure, several modifications and improvements can be made, and these modifications and improvements are also regarded to fall in the protection scope of the present disclosure.

Before introducing technical solutions of the present disclosure, a technical problem in the following related art will be described in detail.

In the display field, a mini light-emitting diode (LED) and a micro LED have advantages of high brightness, high contrast, high color gamut, high resolution, fast reaction time, energy saving, low power consumption, etc., which are considered as a new direction of display revolutionary technology. For example, in order to make a large-size min LED and a large-size micro LED, splicing technology is required. Display panels of the mini LED and micro LED usually consist of multiple display units spliced together. A certain gap exists between display units, which can also be understood as a splicing gap. A display unit needs to transmit an electrical signal with the outside through a connection structure. However, a first conductive layer in an existing connection structure is easy to be corroded. Especially, when the first conductive layer is not connected with other components, the first conductive layer is easy to be exposed to air for a long time, which increases a probability that the first conductive layer is corroded. Even if a conductive adhesive is disposed on the first conductive layer to protect the connection structure, since the conductive adhesive will generate bubbles, the probability that the first conductive layer is corroded cannot be reduced. When a signal is transmitted in a corroded connection structure, the signal is easy to be interfered, which reduces a transmission performance and a transmission effect.

Figure 1:
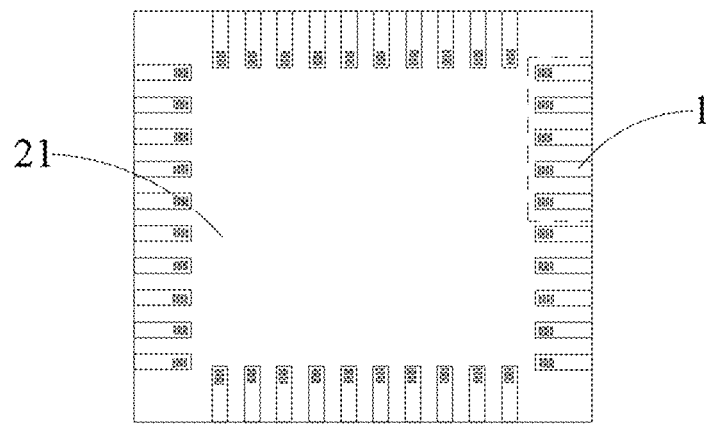
FIG. 1 is a schematic structural diagram of a display unit provided in some implementations of the present disclosure.
Figure 2:
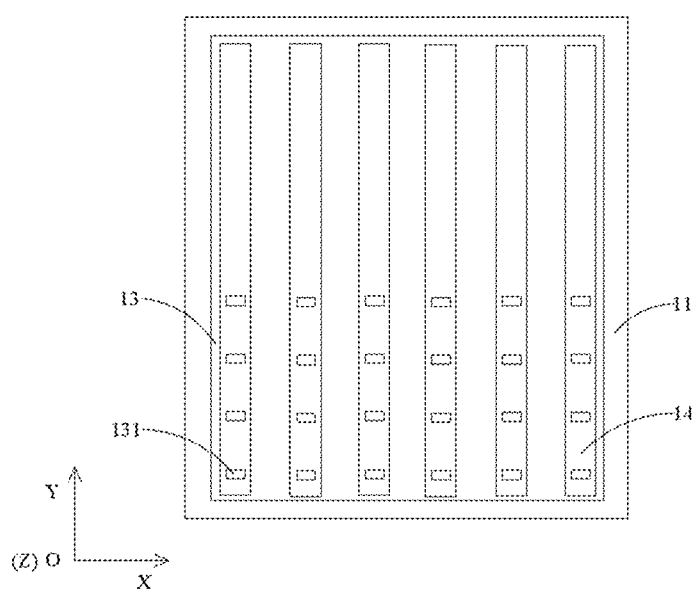
FIG. 2 is a top diagram of a connection structure provided in some implementations of the present disclosure.
Figure 3:
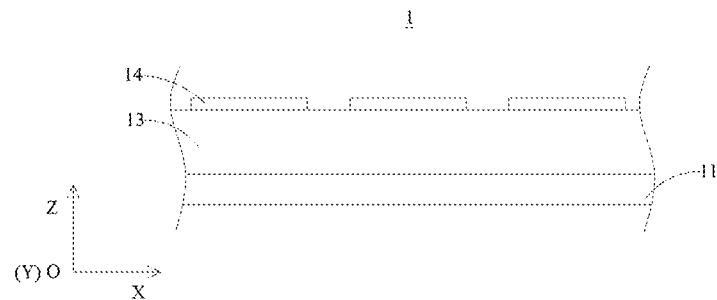
FIG. 3 is a side diagram of a connection structure provided in some implementations of the present disclosure.
Figure 4:
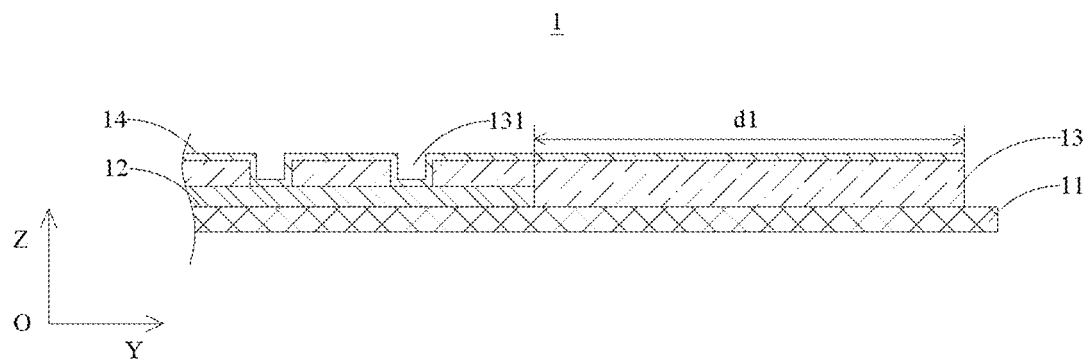
FIG. 4 is a schematic structural diagram of a connection structure provided in some implementations of the present disclosure.

In view of this, in order to solve the above problem, a connection structure is provided in the present disclosure. Reference can be made to FIG. 1 to FIG. 4 together, where FIG. 1 is a schematic structural diagram of a display unit provided in some implementations of the present disclosure, FIG. 2 is a top diagram of a connection structure provided in some implementations of the present disclosure, FIG. 3 is a side diagram of a connection structure provided in some implementations of the present disclosure, and FIG. 4 is a schematic structural diagram of a connection structure provided in some implementations of the present disclosure.

It should be noted that the side diagram of the connection structure provided in the present disclosure is a side diagram from direction Y in FIG. 2. The schematic structural diagram of the connection structure provided in the present disclosure is a schematic structural diagram from direction X in FIG. 2.

As illustrated in FIG. 1 to FIG. 4, a display unit 2 is provided. The display unit 2 includes a light-emitting structure 21 and a connection structure 1 disposed at a periphery of the light-emitting structure 21. The connection structure 1 includes a substrate 11, a first conductive layer 12, an insulating layer 13, and a second conductive layer 14. The first conductive layer 12 is disposed at a side of the substrate 11 and electrically coupled with light-emitting structure 21. The insulating layer 13 is disposed at the side of the substrate 11 and covers the first conductive layer 12. The insulating layer 13 at a side of the first conductive layer 12 away from the substrate 11 defines at least one first through-hole 131 to make the first conductive layer 12 exposed. The second conductive layer 14 is disposed at a side of the insulating layer 13 away from the substrate 11. The second conductive layer 14 is also disposed in the at least one first through-hole 131 and electrically coupled with the first conductive layer 12. The second conductive layer 14 is configured to be electrically coupled with a driving circuit layer.

In addition, the terms "include", "comprise", and "have" as well as variations thereof are intended to cover a non-exclusive inclusion.

It should be noted that terms "first", "second", etc., in the specification, the claims, and the above accompany drawings of the present disclosure are used to distinguish different objects, rather than describe a particular order.

As illustrated in FIG. 1 to FIG. 4, the display unit 2 includes the light-emitting structure 21 and the connection structure 1. An external electrical signal can be transmitted to the light-emitting structure 21 through the connection structure 1 to control the light-emitting structure 21 to operate. The light-emitting structure 21 is configured to emit lights. Formation and a size of the light-emitting structure 21 each are not limited in the present disclosure. In addition, the first conductive layer 12 is electrically coupled with the light-emitting structure 21 to transmit the external electrical signal to the light-emitting structure 21.

As illustrated in FIG. 1 to FIG. 4, the connection structure 1 includes the substrate 11, the substrate 11 can provide a carrying basis for preparation of other components, and can also provide the basis for coordination between other layers to make the connection structure 1 to connect with other components. A shape, a material, and a thickness of the substrate 11 each are not limited in the present disclosure. Optionally, the substrate 11 includes, but is not limited to, a flexible substrate and a non-flexible substrate. Optionally, the material of the substrate 11 includes, but is not limited to, polyimide (PI), polyethylene terephthalate (PET), polyethylene naphthalate two formic acid glycol estr (PEN), cyclo-olefinpolymer (COP), polycarbonate (PC), polystyrene (PS), polypropylene (PP), polytetrafluoroethylene (PTFE), etc.

As illustrated in FIG. 1 to FIG. 4, the connection structure 1 includes the first conductive layer 12, the first conductive layer 12 can be electrically coupled with the light-emitting structure 21 and transmit the electrical signal to control the light-emitting structure. The first conductive layer 12 may also be understood as a metal layer. A shape, a material, and a thickness of the first conductive layer 12 each are not limited in the present disclosure. Optionally, the material of the first conductive layer 12 includes, but is not limited to, copper (Cu), aluminum (Al), molybdenum (Mo), silver (Ag), or other conductive materials.

As illustrated in FIG. 1 to FIG. 4, the connection structure 1 further includes the insulating layer 13, the insulating layer 13 can effectively protect the first conductive layer 12, and other structural members can be continued to be prepared on the insulating layer 13. A shape, a material, and a thickness of the insulating layer 13 each are not limited in the present disclosure. Optionally, the material of the insulating layer 13 includes, but is not limited to, metal, alloy, composite metal, nitrogen-silicon compound, silicon-oxide compound, and other conductive materials. In addition, the insulating layer 13 further defines the at least one first through-hole 131 to make the first conductive layer 12 electrically coupled with the second conductive layer 14, such that the electrical signal can be transmitted between the first conductive layer 12 and the second conductive layer 14.

As illustrated in FIG. 1 to FIG. 4, the connection structure 1 further includes the second conductive layer 14, the second conductive layer 14 can be electrically coupled with the driving circuit layer to transmit the electrical signal to control the display unit. The second conductive layer 14 can also be understood as a transparent conductive layer. A shape, a material, and a thickness of the second conductive layer 14 each are not limited in the present disclosure.

Optionally, the material of the second conductive layer 14 includes, but is not limited to, low-temperature polysilicon, metal-oxide semiconductor, etc. Further optionally, the material of the second conductive layer 14 includes, but is not limited to, indium tin oxide (ITO), indium gallium zinc oxide (IGZO), indium tin zinc oxide (ITZO), etc. Optionally, the second conductive layer 14 can allow a light to pass through.

In an implementation, the second conductive layer 14 has corrosion resistance greater than the first conductive layer 12. In the implementation, the second conductive layer 14 is easy to be exposed to air, but since the second conductive layer 14 has the corrosion resistance greater than the first conductive layer 12, and the second conductive layer 14 is not easy to be corroded, the connection structure 1 can be ensured to have relatively high transmission performance and transmission effect.

Optionally, when the first conductive layer 12 is electrically coupled with the light-emitting structure 21 and the second conductive layer 14 is electrically coupled with the driving circuit layer, the electrical signal of the driving circuit layer can be transmitted to the second conductive layer 14, the second conductive layer 14 can transmit the electrical signal to the first conductive layer 12, and the first conductive layer 12 can transmit the electrical signal to the light-emitting structure 21, to control the light-emitting structure 21 to operate.

Optionally, as illustrated in FIG. 1 to FIG. 4, the substrate 11 of the connection structure 1 has a communication region and a protection region connected with the communication region. In addition, the first conductive layer 12 is disposed corresponding to the communication region. The insulating layer 13 is disposed corresponding to the communication region and the protection region. The second conductive layer 14 is disposed corresponding to the communication region and the protection region. Therefore, the insulating layer 13 covers the first conductive layer 12 to protect the first conductive layer 12.

Specifically, as illustrated in FIG. 1 to FIG. 4, the insulating layer 13 covers the first conductive layer 12, that is, the insulating layer 13 covers a top surface and a peripheral side surface of the first conductive layer 12, such that the first conductive layer 12 is all located in the insulating layer 13 to avoid the first conductive layer 12 from being exposed to air, thereby reducing a probability that the first conductive layer 12 is corroded and reducing a probability that a signal transmitted in the connection structure 1 is easy to be interfered. Comparatively speaking, in the related art, at least part of the first conductive layer 12 in the connection structure 1 is exposed, such that the first conductive layer 12 is easy to be exposed to air, especially when the connection structure 1 is not connected with other components, the first conductive layer 12 is easier to be exposed to air. However, as illustrated in FIG. 1 to FIG. 4, since the insulating layer 13 covers the first conductive layer 12, the probability that the first conductive layer 12 is corroded can be reduced.

Therefore, the insulating layer 13 in the connection structure 1 covers the first conductive layer 12 to avoid the first conductive layer 12 from contacting with air, such that the probability that the first conductive layer 12 is corroded can be reduced, and the probability that the signal transmitted in the connection structure 1 is easy to be interfered can be reduced, thereby improving the transmission performance and the transmission effect of the connection structure 1, and further improving the display effect of the display unit 2.

Optionally, a preparing method of a connection structure 1 is further provided in the present disclosure, and the preparing method includes the following. A substrate 11 is provided. A first conductive layer 12 is formed at a side of the substrate 11, and the first conductive layer 12 is configured to be electrically coupled with a light-emitting structure 21. An insulating layer 13 is formed at the side of the substrate 11 and covers the first conductive layer 12. At least one first through-hole 131 penetrating through the insulating layer 13 is defined to make the first conductive layer 12 exposed. The at least one first through-hole 131 is defined at the insulating layer 13 which is at a side of the first conductive layer 12 away from the substrate 11. A second conductive layer 14 is formed at a side of the insulating layer 13 away from the substrate 11, and the second conductive layer 14 is also disposed in the at least one first through-hole 131 and electrically coupled with the first conductive layer 12. The second conductive layer 14 is configured to be electrically coupled with a driving circuit layer.

A preparing method of a display unit 2 is further provided in the present disclosure, and the preparing method includes the following. A light-emitting structure 21 is provided. The connection structure 1 prepared by the preparing method of the connection structure 1 is provided. The connection structure 1 is made to be disposed at a periphery of the light-emitting structure 21. The first conductive layer 12 of the connection structure 1 is made to be electrically coupled with the light-emitting structure 21.

Figure 5:
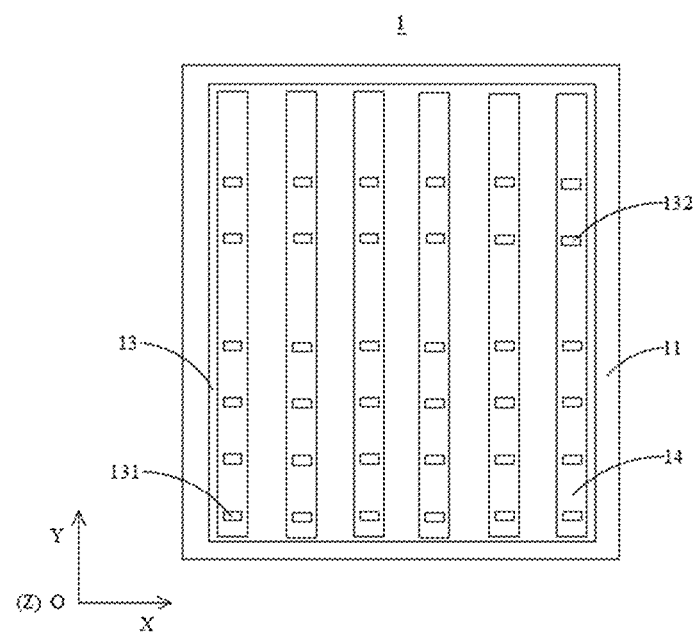
FIG. 5 is a top diagram of a connection structure provided in other implementations of the present disclosure.
Figure 6:
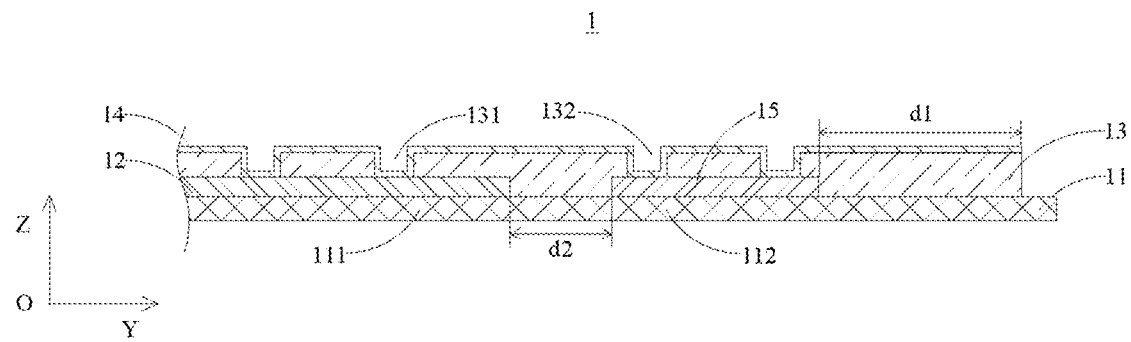
FIG. 6 is a schematic structural diagram of a connection structure provided in other implementations of the present disclosure.

Reference can be made to FIG. 5 to FIG. 6 together, where FIG. 5 is a top diagram of a connection structure provided in other implementations of the present disclosure, and FIG. 6 is a schematic structural diagram of a connection structure provided in other implementations of the present disclosure.

As illustrated in FIG. 5 and FIG. 6, the substrate 11 has a communication region 111 and a protection region 112 connected with the communication region 111. The first conductive layer 12 is disposed corresponding to the communication region 111. The connection structure 1 further includes a third conductive layer 15, and the third conductive layer 15 is disposed at the side of the substrate 11 and corresponding to the protection region 112. The insulating layer 13 also covers the third conductive layer 15. The insulating layer 13 at a side of the third conductive layer 15 away from the substrate 11 defines at least one second through-hole 132 to make the third conductive layer 15 exposed. The second conductive layer 14 is also disposed in the at least one second through-hole 132 and electrically coupled with the third conductive layer 15.

As illustrated in FIG. 5 and FIG. 6, the substrate 11 has the communication region 111 and the protection region 112. An end of the connection structure 1 corresponding to the communication region 111 can be electrically coupled with the light-emitting structure, to transmit an external electrical signal to the light-emitting structure. An end of the connection structure 1 corresponding to the protection region 112 can be electrically coupled with the driving circuit layer, to transmit the external electrical signal to the connection structure 1. In addition, the insulating layer 13 corresponding to the communication region 111 covers a first conductive layer 12, to protect the first conductive layer 12 and reduce the probability that the first conductive layer 12 is corroded. Shapes and sizes of the communication region 111 and the protection region 112 are not limited in the present disclosure.

As illustrated in FIG. 5 and FIG. 6, the connection structure 1 further includes the third conductive layer 15, and the third conductive layer 15 can transmit the electrical signal to reduce impedance of the connection structure 1 which transmits the electrical signal. A shape, a material, and a thickness of the third conductive layer 15 each are not limited in the present disclosure. The first conductive layer 12 and the third conductive layer 15 are disposed on the same layer. Optionally, the material of the third conductive layer 15 includes, but is not limited to, Cu, Al, Mo, Ag, or other conductive materials. Optionally, the third conductive layer 15 and the first conductive layer 12 have the same materials.

Optionally, the third conductive layer 15 includes at least one conductive portion. The insulating layer 13 at a side of the at least one conductive portion away from the substrate 11 defines the at least one second through-hole 132 to make the at least one conductive portion exposed. The second conductive layer 14 is also disposed in the at least one second through-hole 132 and electrically coupled with the conductive portion.

In addition, as illustrated in FIG. 5 and FIG. 6, the insulating layer 13 further defines the at least one second through-hole 132 to make the third conductive layer 15 electrically coupled with the second conductive layer 14, such that the electrical signal can be transmitted between the third conductive layer 15 and the second conductive layer 14.

As illustrated in FIG. 5 and FIG. 6, the third conductive layer 15 is disposed at the insulating layer 13 corresponding to the protection region 112, such that the impedance of the connection structure 1 which transmits the electrical signal is reduced and a performance of the connection structure 1 which transmits the electrical signal is improved. In addition, the third conductive layer 15 is covered by the insulating layer 13, such that the third conductive layer 15 is avoided from being exposed to air, and the probability that the third conductive layer 15 is corroded is reduced, thereby reducing the probability that the signal transmitted in the connection structure 1 is easy to be interfered. Therefore, the third conductive layer 15 is disposed, and the insulating layer 13 covers the third conductive layer 15, such that not only can the impedance of the connection structure 1 which transmits the electrical signal be reduced, but also the probability that the third conductive layer 15 is corroded can be reduced, thereby reducing the probability that the signal transmitted in the connection structure 1 is easy to be interfered and improving the transmission performance and the transmission effect of the connection structure 1, and further improving the display effect of the display unit 2.

Figure 7:
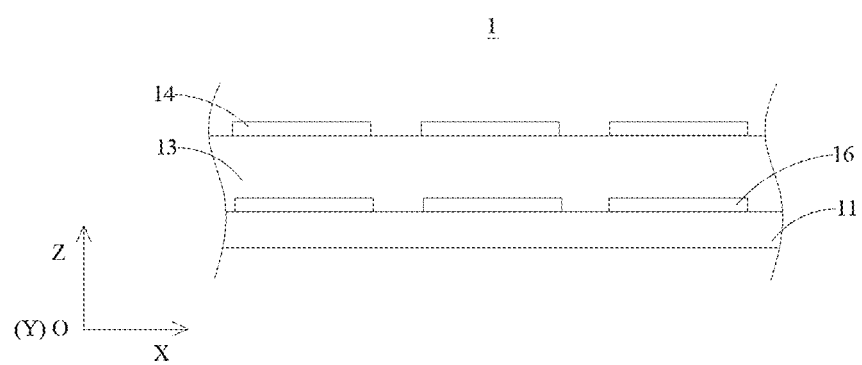
FIG. 7 is a side diagram of a connection structure provided in other implementations of the present disclosure.
Figure 8:
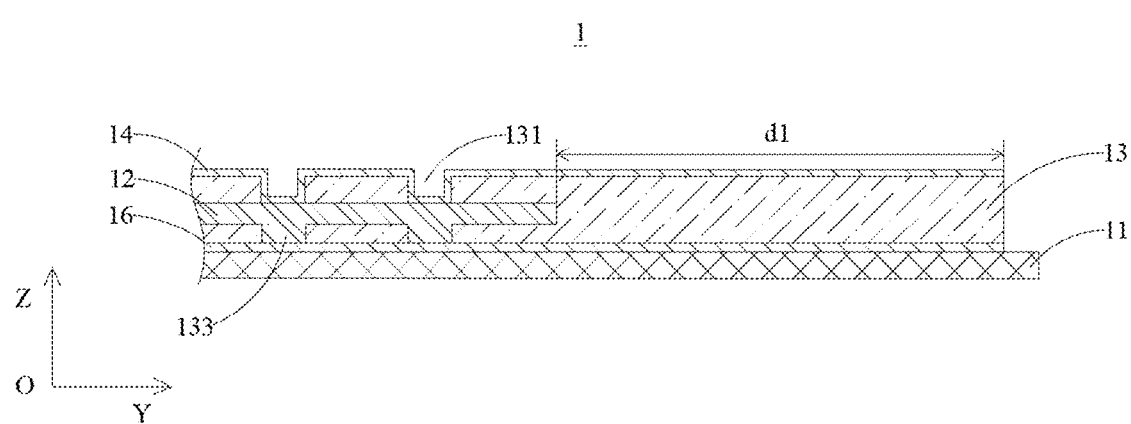
FIG. 8 is a schematic structural diagram of a connection structure provided in other implementations of the present disclosure.

Reference can be made to FIG. 7 and FIG. 8 together, where FIG. 7 is a side diagram of a connection structure provided in other implementations of the present disclosure, and FIG. 8 is a schematic structural diagram of a connection structure provided in other implementations of the present disclosure. In addition, a top diagram of the connection structure provided in other implementations can be referred to FIG. 2 again.

As illustrated in FIG. 7 and FIG. 8, the connection structure 1 further includes a fourth conductive layer 16. The fourth conductive layer 16 is disposed between the first conductive layer 12 and the substrate 11. The insulating layer 13 is also disposed at a side of the fourth conductive layer 16 away from the substrate 11, and the insulating layer 13 also covers part of a side surface of the fourth conductive layer 16. The insulating layer 13 at a side of the fourth conductive layer 16 away from the substrate 11 defines at least one third through-hole 133 to make the fourth conductive layer 16 exposed. The first conductive layer 12 is also disposed in the at least one third through-hole 133 and electrically coupled with the fourth conductive layer 16.

As illustrated in FIG. 7 and FIG. 8, the connection structure 1 further includes the fourth conductive layer 16, and the fourth conductive layer 16 can be electrically coupled with the driving circuit layer and transmit the electrical signal to control the display unit. A shape, a material, and a thickness of the fourth conductive layer 16 each are not limited in the present disclosure. Optionally, the material of the fourth conductive layer 16 includes, but is not limited to, low-temperature polysilicon, metal-oxide semiconductor, etc. Further optionally, the material of the fourth conductive layer 16 includes, but is not limited to, ITO, IGZO, ITZO, etc. Optionally, the fourth conductive layer 16 and the second conductive layer 14 have the same materials. Optionally, the fourth conductive layer 16 has corrosion resistance greater than the first conductive layer 12. Optionally, the fourth conductive layer 16 can allow a light to pass through.

In addition, as illustrated in FIG. 7 and FIG. 8, the insulating layer 13 also covers the part of the side surface of the fourth conductive layer 16. It can also be understood that part of the side surface of the fourth conductive layer 16 is exposed to connect with other components. Moreover, the insulating layer 13 further defines the at least one third through-hole 133 to make the first conductive layer 12 electrically coupled with the fourth conductive layer 16, such that the electrical signal can be transmitted between the first conductive layer 12 and the fourth conductive layer 16.

As illustrated in FIG. 7 and FIG. 8, the fourth conductive layer 16 is disposed, and the fourth conductive layer 16 can be electrically coupled with the driving circuit layer. In this case, the second conductive layer 14 and the fourth conductive layer 16 each can be electrically coupled with the driving circuit layer, such that a contact area between the connection structure 1 and the driving circuit layer is increased, and stability of the connection structure 1 which transmits the electrical signal is improved. In addition, the fourth conductive layer 16 capable of transmitting the electrical signal is disposed in the connection structure 1, such that the impedance of the connection structure 1 which transmits the electrical signal can be reduced, thereby improving the display effect of the display unit 2.

Optionally, when the first conductive layer 12 is electrically coupled with the light-emitting structure, the second conductive layer 14 is electrically coupled with the driving circuit layer, and the fourth conductive layer 16 is electrically coupled with the driving circuit layer, the electrical signal of the driving circuit layer can be transmitted to the second conductive layer 14 and the fourth conductive layer 16, the second conductive layer 14 and the fourth conductive layer 16 can transmit the electrical signal to the first conductive layer 12, and the first conductive layer 12 can transmit the electrical signal to the light-emitting structure 21 to control the light-emitting structure 21 to operate.

Figure 9:
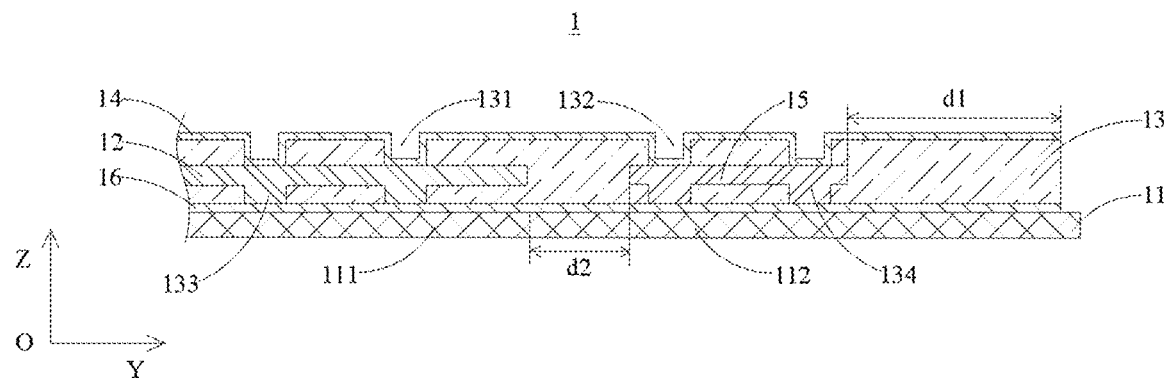
FIG. 9 is a schematic structural diagram of a connection structure provided in other implementations of the present disclosure.

Reference can be made to FIG. 9, which is a schematic structural diagram of a connection structure provided in other implementations of the present disclosure. In addition, a top diagram of the connection structure provided in other implementations of the present disclosure can be referred to FIG. 2 again, and a side diagram of the connection structure provided in other implementations of the present disclosure can be referred to FIG. 8 again.

As illustrated in FIG. 9, the substrate 11 has a communication region 111 and a protection region 112 connected with the communication region 111. The first conductive layer 12 is disposed corresponding to the communication region 111. The connection structure 1 further includes a third conductive layer 15. The third conductive layer 15 is disposed between the fourth conductive layer 16 and the second conductive layer 14 and corresponding to the protection region 112. The insulating layer 13 also covers the third conductive layer 15.

The insulating layer 13 at a side of the third conductive layer 15 away from the substrate 11 defines at least one second through-hole 132 to make the third conductive layer 15 exposed. The second conductive layer 14 is also disposed in the at least one second through-hole 132 and electrically coupled with the third conductive layer 15. The insulating layer 13 at a side of the fourth conductive layer 16 away from the substrate 11 defines at least one fourth through-hole 134 to make the fourth conductive layer 16 exposed. The third conductive layer 15 is also disposed in the at least one fourth through-hole 134 and electrically coupled with the fourth conductive layer 16.

As illustrated in FIG. 9, the connection structure 1 further includes the third conductive layer 15 and the fourth conductive layer 16. The substrate 11 has the communication region 111 and the protection region 112. The third conductive layer 15, the fourth conductive layer 16, the communication region 111, and the protection region 112 have been introduced in detail above, which will not be repeated here. The insulating layer 13 provided in FIG. 9 further defines the at least one second through-hole 132 and the at least one fourth through-hole 134, and the at least one second through-hole 132 makes the second conductive layer 14 electrically coupled with the third conductive layer 15, such that the electrical signal can be transmitted between the second conductive layer 14 and the third conductive layer 15. The at least one fourth through-hole 134 makes the fourth conductive layer 16 electrically coupled with the third conductive layer 15, such that the electrical signal can be transmitted between the fourth conductive layer 16 and the third conductive layer 15.

As illustrated in FIG. 9, in the connection structure 1, the third conductive layer 15 is disposed at the insulating layer 13 corresponding to the protection region 112 and the fourth conductive layer 16 is disposed at the insulating layer 13 corresponding to the communication region 111 and the protection region 112, such that not only can the impedance of the connection structure 1 which transmits the electrical signal be reduced and the performance of the connection structure 1 which transmits the electrical signal be improved, but also the contact area between the connection structure 1 and the driving circuit layer can be increased and the stability of the connection structure 1 which transmits the electrical signal can be improved. In addition, the fourth conductive layer 16 can further reduce the impedance of the connection structure 1 which transmits the electrical signal, thereby improving the performance of the connection structure 1 which transmits the electrical signal, and further improving the display effect of the display unit 2.

In some implementations, each of the at least one first through-hole 131 is directly opposite to each of the at least one third through-hole 133, and/or each of the at least one second through-hole 132 is directly opposite to each of the at least one fourth through-hole 134. Reference can be made to FIG. 9 again. For example, each of the least one first through-hole 131 is directly opposite to each of the at least one third through-hole 133, and each of the at least one second through-hole 132 is directly opposite to each of the at least one fourth through-hole 134.

In some implementations, the first through-hole 131 is directly opposite to the third through-hole 133, and/or the second through-hole 132 is directly opposite to the fourth through-hole 134. Shapes and sizes of the first through-hole 131, the second through-hole 132, the third through-hole 133, and the fourth through-hole 134 are not limited in the present disclosure. The first through-hole 131, the second through-hole 132, the third through-hole 133, and the fourth through-hole 134 have been introduced in detail above, which will not be repeated here.

Therefore, in some implementations, when the insulating layer 13 defines the first through-hole 131 and the third through-hole 133 corresponding to the first through-hole 131, or defines the second through-hole 132 and the fourth through-hole 134 corresponding to the second through-hole 132, positions where through holes are defined do not need to be adjusted, which simplifies a preparing process of the connection structure 1 and improves preparing efficiency of the connection structure 1.

Figure 10:
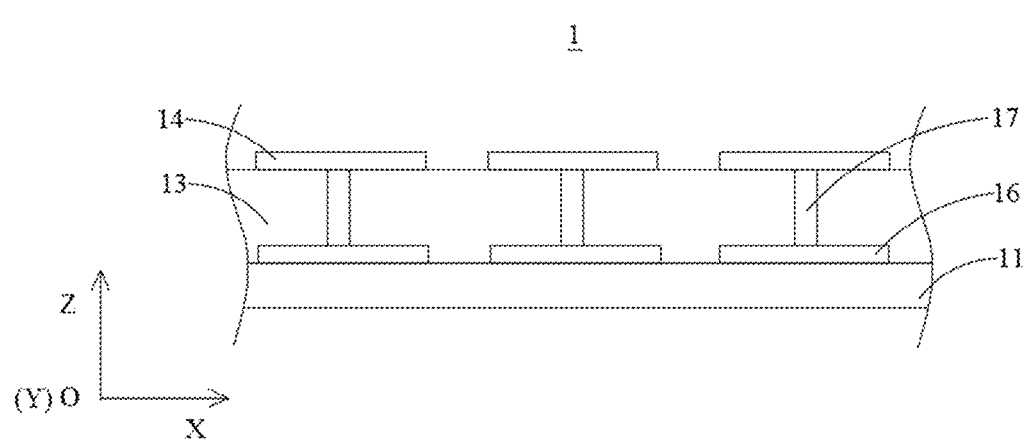
FIG. 10 is a side diagram of a connection structure provided in other implementations of the present disclosure.
Figure 11:
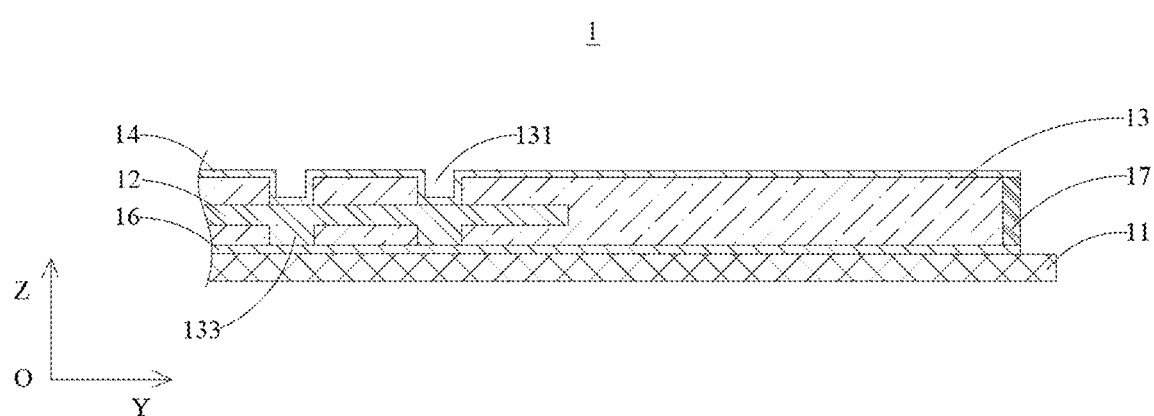
FIG. 11 is a schematic structural diagram of a connection structure provided in other implementations of the present disclosure.
Figure 12:
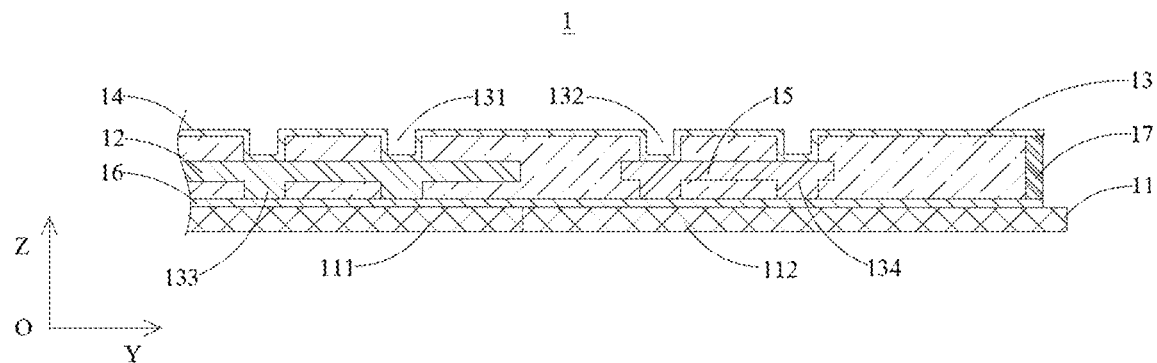
FIG. 12 is a schematic structural diagram of another connection structure provided in other implementations of the present disclosure.

Reference can be made to FIG. 10 to FIG. 12 together, where FIG. 10 is a side diagram of a connection structure provided in other implementations of the present disclosure, FIG. 11 is a schematic structural diagram of a connection structure provided in other implementations of the present disclosure, and FIG. 12 is a schematic structural diagram of another connection structure provided in other implementations of the present disclosure.

As illustrated in FIG. 10 to FIG. 12, the connection structure 1 further includes a fifth conductive layer 17, the fifth conductive layer 17 penetrates through the insulating layer 13 and has two opposite ends electrically coupled with the second conductive layer 14 and the fourth conductive layer 16 respectively, and the fifth conductive layer 17 has a side surface exposed beyond the insulating layer 13.

As illustrated in FIG. 10 to FIG. 12, the connection structure 1 further includes the fifth conductive layer 17, and the fifth conductive layer 17 can be electrically coupled with the driving circuit layer and transmit the electrical signal to control the display unit. A shape, a material, and a thickness of the fifth conductive layer 17 each are not limited in the present disclosure. Optionally, the material of the fifth conductive layer 17 includes, but is not limited to, low-temperature polysilicon, metal-oxide semiconductor, etc. Further optionally, the material of the fifth conductive layer 17 includes, but is not limited to, ITO, IGZO, ITZO, etc. Optionally, the fifth conductive layer 17, the second conductive layer 14, and the fourth conductive layer 16 have the same materials. Optionally, the fifth conductive layer 17 has corrosion resistance greater than the first conductive layer 12. Optionally, the fifth conductive layer 17 can allow a light to pass through.

As illustrated in FIG. 10 to FIG. 12, the fifth conductive layer 17 has the side surface exposed beyond the insulating layer 13, which can also be understood that part of the side surface of the fifth conductive layer 17 is exposed to be connected with other components. Therefore, the fifth conductive layer 17 can also be electrically coupled with the driving circuit layer. In this case, the second conductive layer 14, the fourth conductive layer 16, and the fifth conductive layer 17 each can be electrically coupled with the driving circuit layer, such that the contact area between the connection structure 1 and the driving circuit layer is further increased, and the stability of the connection structure 1 which transmits the electrical signal is further improved. In addition, the fifth conductive layer 17 capable of transmitting the electrical signal is disposed in the connection structure 1, such that the impedance of the connection structure 1 which transmits the electrical signal can also be further reduced, thereby improving the display effect of the display unit 2.

Optionally, when the first conductive layer 12 is electrically coupled with the light-emitting structure, the second conductive layer 14 is electrically coupled with the driving circuit layer, fourth conductive layer 16 is electrically coupled with the driving circuit layer, and the fifth conductive layer 17 is electrically coupled with the driving circuit layer, the electrical signal of the driving circuit layer can be transmitted to the second conductive layer 14, the fourth conductive layer 16, and the fifth conductive layer 17, the fifth conductive layer 17 can transmit the electrical signal to the second conductive layer 14 and the fourth conductive layer 16, the second conductive layer 14 and the fourth conductive layer 16 can transmit the electrical signal to the first conductive layer 12, and the first conductive layer 12 can transmit the electrical signal to the light-emitting structure 21 to control the light-emitting structure 21 to operate.

Reference can be made to FIG. 4, FIG. 6, FIG. 8, and FIG. 9. The substrate 11 has a communication region 111 and a protection region 112 connected with the communication region 111, and the first conductive layer 12 is disposed corresponding to the communication region 111. A first distance, between an end surface of the insulating layer 13 disposed corresponding to the protection region 112 and an end surface of the first conductive layer 12 close to the protection region 112, or between the end surface of the insulating layer 13 disposed corresponding to the protection region 112 and an end surface of the third conductive layer 15 away from the first conductive layer 12, is d1, where d1 satisfies 100 μm≤d1≤150 μm. Specifically, d1 can also satisfy 100 μm≤d1≤140 μm, 100 μm≤d1≤130 μm, 100 μm≤d1≤120 μm, and 100 μm≤d1≤110 μm.

In an implementation, as illustrated in FIG. 4 and FIG. 8, when the connection structure 1 does not include the third conductive layer 15, first distance d1 between the end surface of the insulating layer 13 disposed corresponding to the protection region 112 and the end surface of the first conductive layer 12 close to the protection region 112 satisfies 100 μm≤d1≤150 μm. In another implementation, as illustrated in FIG. 6 and FIG. 9, when the connection structure 1 includes the third conductive layer 15, first distance d1 between the end surface of the insulating layer 13 disposed corresponding to the protection region 112 and the end surface of the third conductive layer 15 away from the first conductive layer 12, satisfies 100 μm≤d1≤150 μm.

A size of d1 is designed within the above range, which cannot only reduce a space occupied by the connection structure 1 and reduce production costs, but also ensure relatively high cutting accuracy when preparing the connection structure 1. If the size of d1 is too large, the connection structure 1 will take up too much space and the production costs will be increased. If the size of d1 is too small, the cutting accuracy will be reduced when cutting the connection structure during preparing, and even the first conductive layer 12 may be exposed, such that a probability that a waste product is produced will be increased. Therefore, the size of d1 ranges from 100 μm to 150 μm, which cannot only ensure the relatively high cutting accuracy when preparing the connection structure 1, but also reduce the space occupied by the connection structure 1 and reduce the production costs.

Reference can be made to FIG. 6 to FIG. 9, a second distance between the first conductive layer 12 and the third conductive layer 15 is d2, where d2 satisfies 10 μm≤d2≤100 μm. Specifically, d2 can also satisfy 30 μm≤d2≤100 μm, 50 μm≤d2≤100 μm, 70 μm≤d2≤100 μm, and 90 μm≤d2≤100 μm.

A size of d2 is designed within the above range, which cannot only reduce the space occupied by the connection structure 1, but also ensure to reduce the impedance of the connection structure 1 which transmits the electrical signal and improve the performance of the connection structure 1 which transmits the electrical signal. If the size of d2 is too large, an overall size of the connection structure 1 will be large, which will lead to too much occupied space and increase of the production costs. If the size of d2 is too small, the effect that the third conductive layer 15 reduces the impedance of the connection structure 1 which transmits the electrical signal will be affected. Therefore, the size of d2 ranges from 10 μm to 100 μm, which cannot only ensure to reduce the impedance of the connection structure 1 which transmits the electrical signal and improve the performance of the connection structure 1 which transmits the electrical signal, but also reduce the space occupied by the connection structure 1 and reduce the production costs.

It should be noted that in the present disclosure, the first conductive layer 12, the second conductive layer 14, the third conductive layer 15, the fourth conductive layer 16, and the fifth conductive layer 17 of the connection structure 1 each can transmit the electrical signal. Specifically, transmission of the electrical signal includes, but is not limited to, reception of the electrical signal, emission of the electrical signal, etc.

Figure 13:
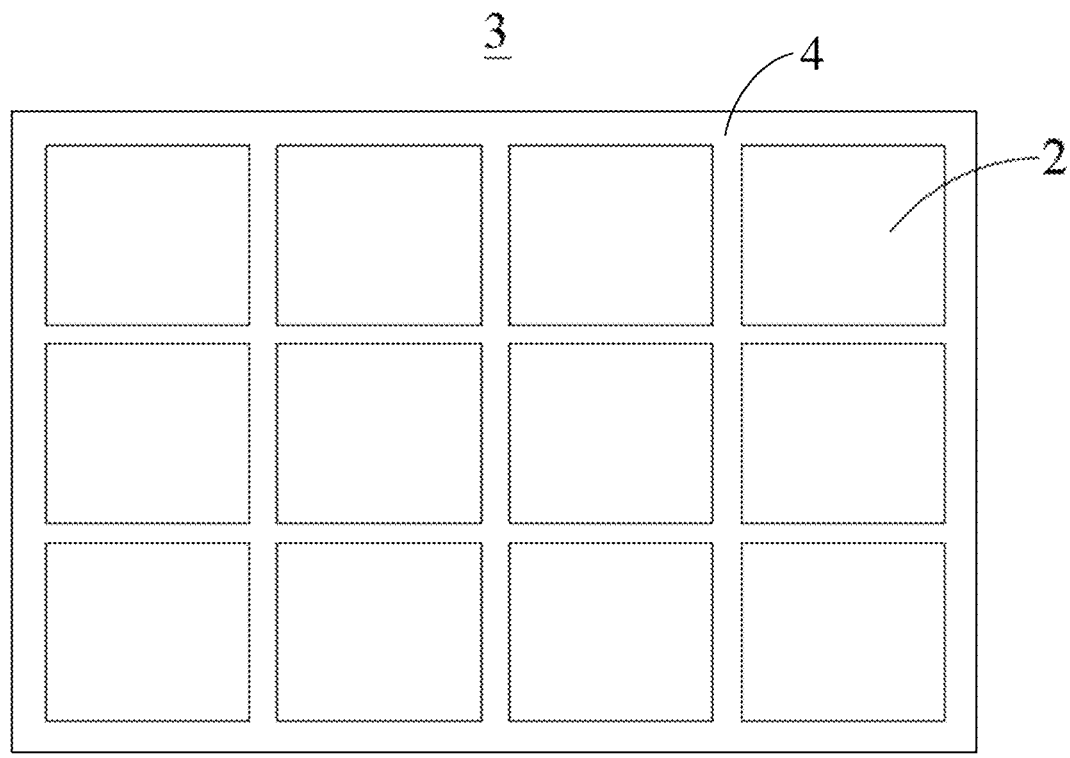
FIG. 13 is a schematic structural diagram of a display panel provided in other implementations of the present disclosure.

Reference can be made to FIG. 13, which is a schematic structural diagram of a display panel provided in other implementations of the present disclosure. As illustrated in FIG. 13, a display panel 3 is further provided in the present disclosure. The display panel 3 includes a driving circuit layer 4 and multiple display units 2 provided as described in the present disclosure above and arranged at intervals. The driving circuit layer 4 is electrically coupled with second conductive layers 14 of connection structures 1 of the multiple display units 2.

As illustrated in FIG. 13, the display panel 3 includes the driving circuit unit 2 and the multiple display units 2. The electrical signal of the driving circuit layer 4 can be transmitted to the second conductive layer 14, the second conductive layer 14 transmits the electrical signal to the first conductive layer 12, and the first conductive layer 12 transmits the electrical signal to the light-emitting structure 21 of the display unit 2 to control the display unit 2 to operate. The driving circuit layer 4 can transmit the electrical signal. Formation and a size of the driving circuit layer 4 each are not limited in the present disclosure. The display unit 2 has been introduced in detail above, which will not be repeated here. In addition, the driving circuit layer 4 can transmit the external electrical signal to the second conductive layer 14.

Therefore, as illustrated in FIG. 13, since the display panel 3 adopts the display unit 2 provided in the present disclosure, the probability that the first conductive layer 12 in the connection structure 1 is corroded can be reduced, such that the probability that the signal transmitted in the connection structure 1 is easy to be interfered is reduced, and the transmission performance and the transmission effect of the connection structure 1 are improved, thereby improving the display effect of the display unit 2 and the display effect of the display panel 3.

The contents provided by the implementations of the present disclosure are introduced in detail above, and principles and implementations of the present disclosure present are expounded and described herein. The above description is only used to help understand methods and core ideas of the present disclosure. In the meanwhile, for those of ordinary skill in the art, the specific implementations and the scope of application will be changed according to the idea of the present disclosure. In summary, the contents of the specification should not be construed as a limitation of the present disclosure.

What is claimed is:

1. A display unit, comprising:
   a light-emitting structure; and
   a connection structure disposed at a periphery of the light-emitting structure, wherein the connection structure comprises:
      a substrate having a communication region and a protection region connected with the communication region;
      a first conductive layer disposed at a side of the substrate and electrically coupled with light-emitting structure, wherein the first conductive layer is disposed corresponding to the communication region;
      an insulating layer disposed at the side of the substrate and covering the first conductive layer, wherein the insulating layer at a side of the first conductive layer away from the substrate defines at least one first through-hole to make part of the first conductive layer exposed;
      a second conductive layer disposed at a side of the insulating layer away from the substrate, wherein the second conductive layer is also disposed in the at least one first through-hole and electrically coupled with the first conductive layer, and the second conductive layer is configured to be electrically coupled with a driving circuit layer;
      a third conductive layer, wherein the third conductive layer is disposed between the fourth conductive layer and the second conductive layer and corresponding to the protection region, and the insulating layer also covers the third conductive layer; and
      a fourth conductive layer, wherein the fourth conductive layer is disposed between the first conductive layer and the substrate, the insulating layer is also disposed at a side of the fourth conductive layer away from the substrate, the insulating layer also covers part of a side surface of the fourth conductive layer, the insulating layer at a side of the fourth conductive layer away from the substrate defines at least one third through-hole to make part of the fourth conductive layer exposed, and the first conductive layer is also disposed in the at least one third through-hole and electrically coupled with the fourth conductive layer;
      wherein the insulating layer at a side of the third conductive layer away from the substrate defines at least one second through-hole to make part of the third conductive layer exposed, and the second conductive layer is also disposed in the at least one second through-hole and electrically coupled with the third conductive layer; and the insulating layer at a side of the fourth conductive layer away from the substrate defines at least one fourth through-hole to make part of the fourth conductive layer exposed, and the third conductive layer is also disposed in the at least one fourth through-hole and electrically coupled with the fourth conductive layer.

2. The display unit of claim 1, wherein each of the at least one first through-hole is directly opposite to each of the at least one third through-hole, and/or each of the at least one second through-hole is directly opposite to each of the at least one fourth through-hole.

3. The display unit of claim 1, wherein the connection structure further comprises a fifth conductive layer, the fifth conductive layer penetrates through the insulating layer and has two opposite ends electrically coupled with the second conductive layer and the fourth conductive layer respectively, and the fifth conductive layer has a side surface exposed beyond the insulating layer.

4. The display unit of claim 1, wherein the insulating layer is disposed corresponding to the communication region and the protection region, wherein,
   a first distance between an end surface of the insulating layer disposed corresponding to the protection region and an end surface of the first conductive layer close to the protection region is d1, d1 satisfying 100 $\mu m \leq d1 \leq 150$ $\mu m$.

5. The display unit of claim 1, wherein the insulating layer is disposed corresponding to the communication region and the protection region, wherein,
   a first distance between an end surface of the insulating layer disposed corresponding to the protection region and an end surface of the third conductive layer away from the first conductive layer is d1, d1 satisfying 100 $\mu m \leq d1 \leq 150$ $\mu m$.

6. The display unit of claim 4, wherein the second conductive layer is disposed corresponding to the communication region and the protection region.

7. The display unit of claim 1, wherein a second distance between the first conductive layer and the third conductive layer is d2, d2 satisfying 10 $\mu m \leq d2 \leq 100$ $\mu m$.

8. The display unit of claim 1, wherein a second distance between the first conductive layer and the third conductive layer is d2, d2 satisfying 10 $\mu m \leq d2 \leq 100$ $\mu m$.

9. The display unit of claim 1, wherein the second conductive layer has corrosion resistance greater than the first conductive layer.

10. The display unit of claim 1, wherein the fourth conductive layer has corrosion resistance greater than the first conductive layer.

11. The display unit of claim 3, wherein the fifth conductive layer has corrosion resistance greater than the first conductive layer.

12. A display panel, comprising:
    a driving circuit layer; and
    a plurality of display units arranged at intervals, wherein each of the plurality of display units comprises:
       a light-emitting structure; and
       a connection structure disposed at a periphery of the light-emitting structure,
    wherein the connection structure comprises:
       a substrate;
       a first conductive layer disposed at a side of the substrate and electrically coupled with light-emitting structure;
       an insulating layer disposed at the side of the substrate and covering the first conductive layer, wherein the insulating layer at a side of the first conductive layer away from the substrate defines at least one first through-hole to make part of the first conductive layer exposed;
       a second conductive layer disposed at a side of the insulating layer away from the substrate, wherein the second conductive layer is also disposed in the at least one first through-hole and electrically coupled with the first conductive layer, the second conductive layer is electrically coupled with the driving circuit layer, and the driving circuit layer is electrically coupled with second conductive layers of connection structures of the plurality of display units;
a fourth conductive layer, wherein the fourth conductive layer is disposed between the first conductive layer and the substrate, the insulating layer is also disposed at a side of the fourth conductive layer away from the substrate, the insulating layer also covers part of a side surface of the fourth conductive layer, the insulating layer at a side of the fourth conductive layer away from the substrate defines at least one third through-hole to make part of the fourth conductive layer exposed, and the first conductive layer is also disposed in the at least one third through-hole and electrically coupled with the fourth conductive layer; and
a fifth conductive layer, wherein the fifth conductive layer penetrates through the insulating layer and has two opposite ends electrically coupled with the second conductive layer and the fourth conductive layer respectively, and the fifth conductive layer has a side surface exposed beyond the insulating layer.

* * * * *